US008971976B2

(12) United States Patent
Harrison

(10) Patent No.: US 8,971,976 B2
(45) Date of Patent: Mar. 3, 2015

(54) SUPERCONDUCTIVE ELECTROMAGNET APPARATUS

(71) Applicant: Samsung Electronics Co., Ltd., Suwon-si (KR)

(72) Inventor: Stephen M Harrison, Wallingford (GB)

(73) Assignee: Samsung Electronics Co., Ltd., Suwon-si (KR)

(*) Notice: Subject to any disclaimer, the term of this patent is extended or adjusted under 35 U.S.C. 154(b) by 149 days.

(21) Appl. No.: 13/649,596

(22) Filed: Oct. 11, 2012

(65) Prior Publication Data

US 2013/0090241 A1 Apr. 11, 2013

(30) Foreign Application Priority Data

Oct. 11, 2011 (KR) ........................ 10-2011-0103793

(51) Int. Cl.
G01R 33/035 (2006.01)
G01R 33/3815 (2006.01)
H01F 6/04 (2006.01)
G01R 33/38 (2006.01)

(52) U.S. Cl.
CPC .............. *G01R 33/3815* (2013.01); *H01F 6/04* (2013.01); *G01R 33/3804* (2013.01)
USPC ....................................................... 505/162

(58) Field of Classification Search
CPC ........... G01R 33/0358; G01R 33/0352; H01L 39/225
See application file for complete search history.

(56) References Cited

U.S. PATENT DOCUMENTS

2004/0145366 A1 7/2004 Baudenbacher et al.
2011/0031253 A1 2/2011 Nowak et al.

FOREIGN PATENT DOCUMENTS

| JP | 5-48156 A | | 2/1993 |
| JP | 2000-133514 A | | 5/2000 |
| JP | 2003-178914 | * | 6/2003 |
| JP | 2003-178914 A | | 6/2003 |
| JP | 2004-127964 | * | 4/2004 |
| JP | 2004-127964 A | | 4/2004 |

OTHER PUBLICATIONS

Communication dated Mar. 14, 2013, issued by the International Searching Authority in counterpart International Patent Application No. PCT/KR2012/008255.

* cited by examiner

Primary Examiner — Colleen Dunn
(74) Attorney, Agent, or Firm — Sughrue Mion, PLLC

(57) ABSTRACT

A superconductive electromagnet apparatus and a magnetic resonance imaging apparatus including the superconductive electromagnet apparatus are provided. The superconductive electromagnet apparatus includes a thermal anchor, a cryogenic cooling device which cools the thermal anchor, and at least one connecting ring into which the thermal anchor is inserted and a plurality of wires which are connected to the connecting ring.

24 Claims, 4 Drawing Sheets

SUPERCONDUCTIVE ELECTROMAGNET APPARATUS

CROSS-REFERENCE TO RELATED APPLICATION

This application claims priority from Korean Patent Application No. 2011-0103793, filed on Oct. 11, 2011 in the Korean Intellectual Property Office, the disclosure of which is incorporated herein by reference in its entirety.

BACKGROUND

1. Field

Apparatuses consistent with exemplary embodiments relate to a superconductive magnet apparatus operating as a superconductive electromagnet at a cryogenic state.

2. Description of the Related Art

In the related art, a superconductive electromagnet apparatus is configured to be applied with a current and generate a strong magnetic force by operating as a superconductive magnet at a cryogenic state.

The superconductive electromagnet apparatus as such includes a coil assembly having a coil which generates a magnetic field by being applied with a current, a helium container in which the coil assembly and a liquefied helium are accommodated, a cryogenic cooling device which cools the helium such that the helium disposed inside the helium container may maintain the cryogenic state, and a power supplying apparatus which supplies a current to the coil assembly and the cryogenic cooling device, and a current is supplied to the coil of the coil assembly through a wire which extends from the power supplying apparatus and connects to the coil.

A magnetic resonance imaging apparatus uses the superconductive electromagnet apparatus to obtain a cross-sectional image of a body by using a nuclear magnetic resonance phenomenon that is generated by a strong magnetic force generated from the superconductive electromagnet apparatus, and is referred to as a Magnetic Resonance Imaging (MRI).

SUMMARY

One or more exemplary embodiments provide a superconductive electromagnet apparatus which prevents an outside heat from being delivered to a coil through a wire which extends from a power supplying apparatus and connects to the coil.

In accordance with an aspect of an exemplary embodiment, there is provided a superconductive electromagnet apparatus including a thermal anchor, a cryogenic cooling device which cools the thermal anchor, at least one connecting ring into which the thermal anchor is inserted and a plurality of wires which are connected to the connecting ring.

The thermal anchor may include a body part and a flange part. The body part may be formed in a shape corresponding to a shape of an inner circumferential surface of the connecting ring and may be inserted into an inside the connecting ring. The flange part may extend from a first end of the body part.

The inner circumferential surface of the connecting ring may have a circular ring shape, and an outer surface of the body part may have a cylindrical shape to correspond to the inner circumferential surface of the connecting ring.

The at least one connecting ring may include a plurality of connecting parts to which the plurality of wire are connected.

The at least one connecting ring may include an insulation layer provided on a surface thereof.

The insulation layer may include a first insulation layer provided on an inner circumferential surface of the connecting ring which contacts the thermal anchor.

The at least one connecting ring may include a plurality of connecting rings which are sequentially installed on the body part, and the insulation layer may include a second insulation layer provided on surfaces of each of the connecting rings substantially perpendicular to the inner circumferential surface which contacts the thermal anchor.

The at least one connecting ring may be made up of aluminum, and the insulation layer may include an anodized aluminum layer provided on a surface of the connecting ring.

The at least one connecting ring may include a metal having a heat contraction that is greater than a heat contraction of the thermal anchor.

The thermal anchor may include a copper or a copper alloy material, and the connecting ring may include a material selected from the group consisting of aluminum, aluminum alloy, magnesium, and magnesium alloy.

The thermal anchor may include a fixation part fixed to the cryogenic cooling device. The superconductive electromagnet apparatus may further include a fixation member installed at the fixation part such that the cryogenic cooling device is installed between the fixation part and the fixation member.

Each of the fixation part and the fixation member has a semicircular arc shape.

The superconductive electromagnet apparatus may further include a coil and a power supplying apparatus. The coil may be supplied with a current to generate a magnetic field. The power supplying apparatus may be configured to supply a power to the coil. The plurality of wires may include a first wire extended from the coil and a second wire extended from the power supplying apparatus.

The at least one connecting ring may include a plurality of connecting rings sequentially installed at the body part. The superconductive electromagnet apparatus may further include at least one spacer disposed in between the connecting rings to maintain a distance between each of the connecting rings among the plurality of connecting rings.

A magnetic resonance imaging apparatus configured to obtain a cross-section image of a body may include the superconductive electromagnet apparatus of the current embodiment.

In accordance with another aspect of the exemplary embodiment, there is provided a superconductive electromagnet apparatus including a coil, a power supplying apparatus, a cryogenic cooling device, a thermal anchor, and at least one connecting ring, a first wire and a second wire. The power supplying apparatus may supply a current. The coil may receive the current and generate a magnetic field by being supplied with a current. The cryogenic cooling device may cool the coil and the thermal anchor thereby maintaining the coil at a cryogenic state. The at least one connecting ring may engage with the thermal anchor i. A first wire which extends from the coil connects to the connecting the connecting ring and a second wire which extends from the current supplying apparatus connects to the connecting ring.

In accordance with another aspect of the exemplary embodiment, there is provided a superconductive electromagnet apparatus including a thermal anchor having a body part, a flange part and a fixation part; a cryogenic cooling device connected to the fixation part of the thermal anchor; at least one connecting ring installed on the body part of the thermal anchor; a power supplying apparatus which supplies a current; and a wire which extends from the power supplying apparatus to the at least one connecting ring installed on the body part of the thermal anchor. The cryogenic cooling device cools the thermal anchor and the thermal anchor is configured to prevent heat delivered from the power supplying apparatus through the wire from being delivered to a coil assembly of the superconductive electromagnet apparatus.

As described above, the superconductive electromagnet apparatus in accordance with the an aspect of an exemplary embodiment, may prevent the heat from being delivered to the coil through the wire, even in a case when a heat from an outside is delivered through a wire, since the heat is absorbed to the cryogenic cooling device through the thermal anchor, and accordingly, the superconductive electromagnet apparatus may further operate in a more stable manner.

BRIEF DESCRIPTION OF THE DRAWINGS

The above and/or other aspects of the disclosure will become apparent and more readily appreciated from the following description of exemplary embodiments, taken in conjunction with the accompanying drawings of which.

DETAILED DESCRIPTION

Figure 1:
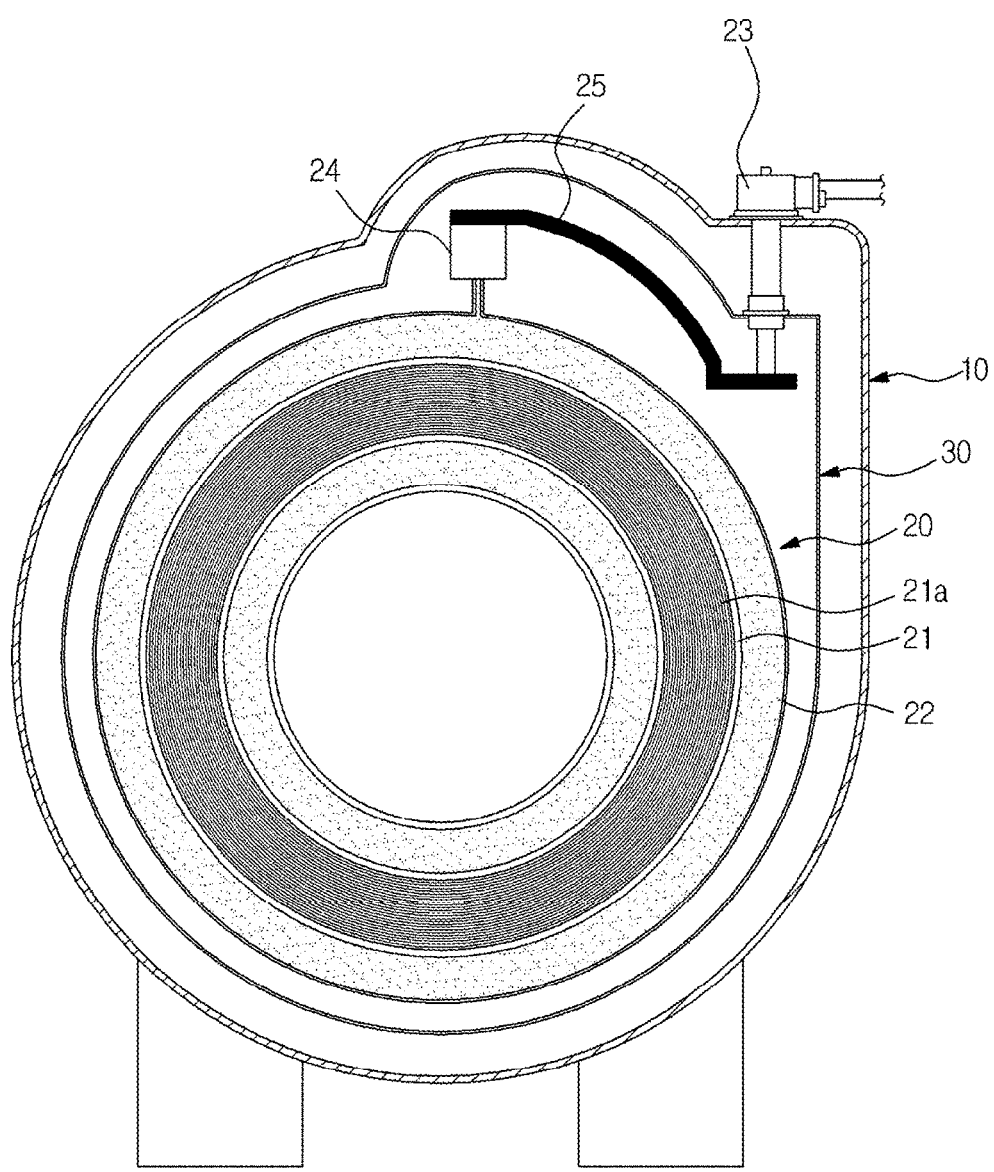
FIG. 1 is a schematic drawing illustrating a magnetic resonance imaging apparatus according to an exemplary embodiment.

Reference will now be made in detail to the exemplary embodiments, examples of which are illustrated in the accompanying drawings, wherein like reference numerals refer to like elements throughout.

As illustrated on FIG. 1, a magnetic resonance imaging apparatus according to an exemplary embodiment includes a housing 10 forming an exterior of the magnetic resonance imaging apparatus, and a superconductive electromagnet apparatus 20 installed therein.

The housing 10 has a ring shape such that a patient may enter an interior of the superconductive electromagnet apparatus 20, and an interior surface of the housing 10 is provided with a plurality of insulation layers disposed therein for insulation.

The superconductive electromagnet apparatus 20 includes a coil assembly 21 having a coil 21a configured to operate as a superconductive electromagnet by being supplied with a current from the power supplying apparatus 40, a helium container 22 that has a ring shape, is filled with liquefied helium and accommodates the coil assembly 21 therein, and a cryogenic cooling device 23 which cools the helium to maintain the liquefied state. The superconductive electromagnet apparatus 20 includes the power supplying apparatus 40 which connects to an external power source through a wire W (see FIG. 2) and supplies a current to the coil 21a and the cryogenic cooling device 23.

In addition, the superconductive electromagnet apparatus 20 includes a condensing chamber 24 provided at an upper side of the helium container 22 and to which the helium in a vaporized state is introduced, and a heat delivering member 25 having one end thereof disposed at an upper surface of the condensing chamber 24 and another end thereof connected to the cryogenic cooling device 23. A vacuum container 30 is disposed in between the housing 10 and the helium container 22 to accommodate the helium container 22 and an interior of the vacuum container 30 is maintained in a vacuum state for insulation purposes.

When a heat is generated at the coil assembly 21, the heat is absorbed by the liquefied helium in the helium container 22 and the heat evaporates a portion of the liquefied helium. This heat transfer enables the coil assembly 21 to maintain the cryogenic state.

The helium in a vaporized state that is evaporated by the heat generated by the coil assembly 21 is moved to an upper side of the coil assembly 21 due the difference in density between the helium in a vaporized state and the helium in a liquefied state, and is introduced to the condensing chamber 24. The helium in a vaporized state that is introduced to the condensing chamber 24 contacts one end of the heat delivering member 25 disposed at an upper surface of the condensing chamber 24 and changes into a liquefied state, and the liquefied helium is introduced into the inside the helium container 22 again after freefalling by gravity.

In addition, the superconductive electromagnet apparatus 20 is provided with the wires W connected thereto for delivering the current from the power supplying apparatus 40 to the coil 21 a disposed inside the coil assembly 21.

The wires W are formed with metals having a high heat conductivity and high electrical conductivity. Thus, the wires W deliver not only the current but also the heat from an outside to the coil 21a, and when the temperature of the coil 21a is increased as the heat is delivered to the coil 21a, the operation of the superconductive electromagnet apparatus 20 may become unstable as the superconductive electromagnet apparatus 20 operates in the cryogenic state while operating in a superconductive state.

Figure 2:
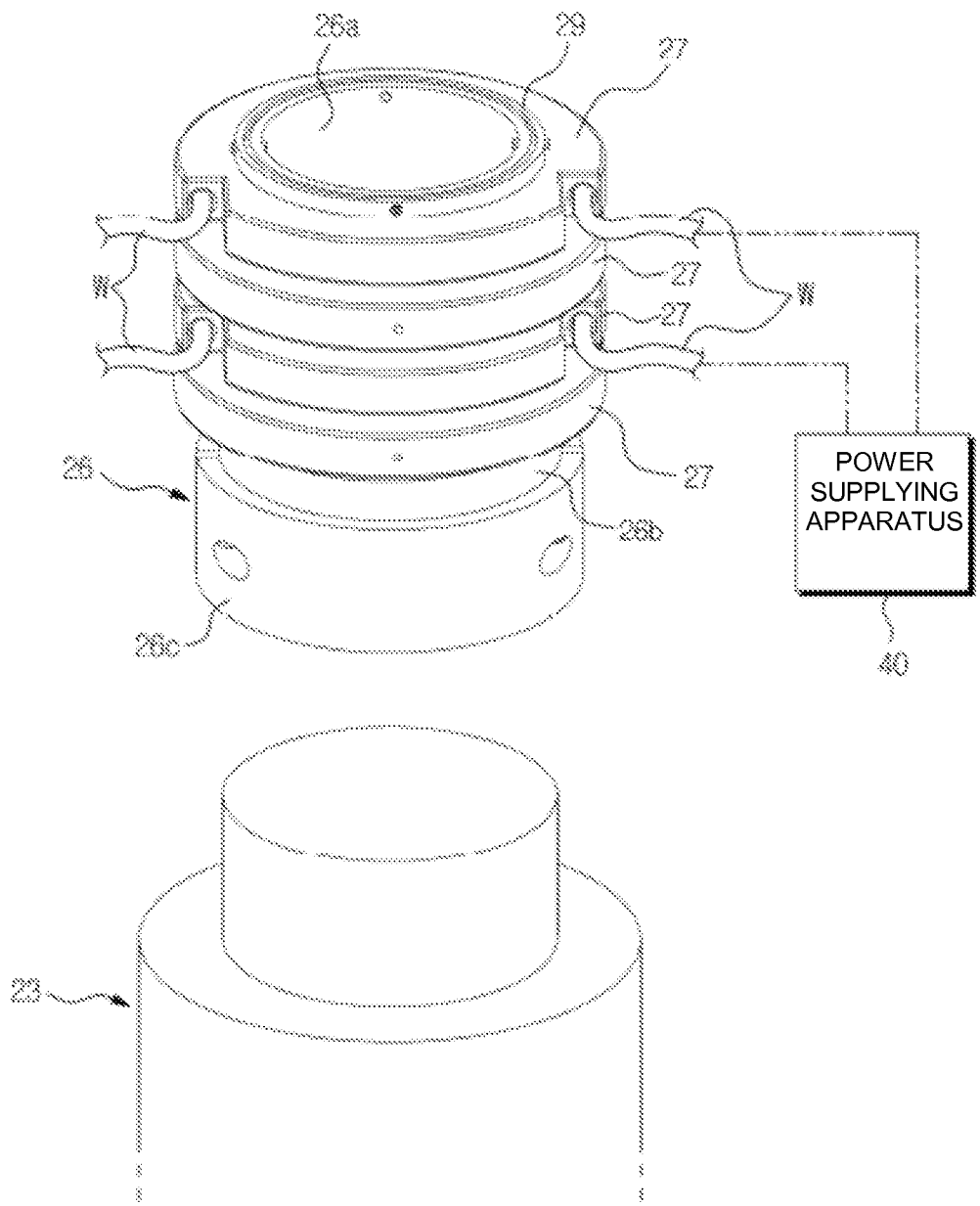
FIG. 2 is a perspective view illustrating a thermal anchor of the magnetic resonance imaging apparatus according to the exemplary embodiment.

Thus, as illustrated on FIG. 2, the superconductive electromagnet apparatus 20 according to an exemplary embodiment includes a thermal anchor 26 configured to prevent the heat, which is delivered from the power supplying apparatus 40 through the wires W, from being delivered to the coil assembly 21, and a plurality of connecting rings 27 into which thermal anchor 26 is inserted and provided with the plurality of wires W connected thereto.

Figure 3:
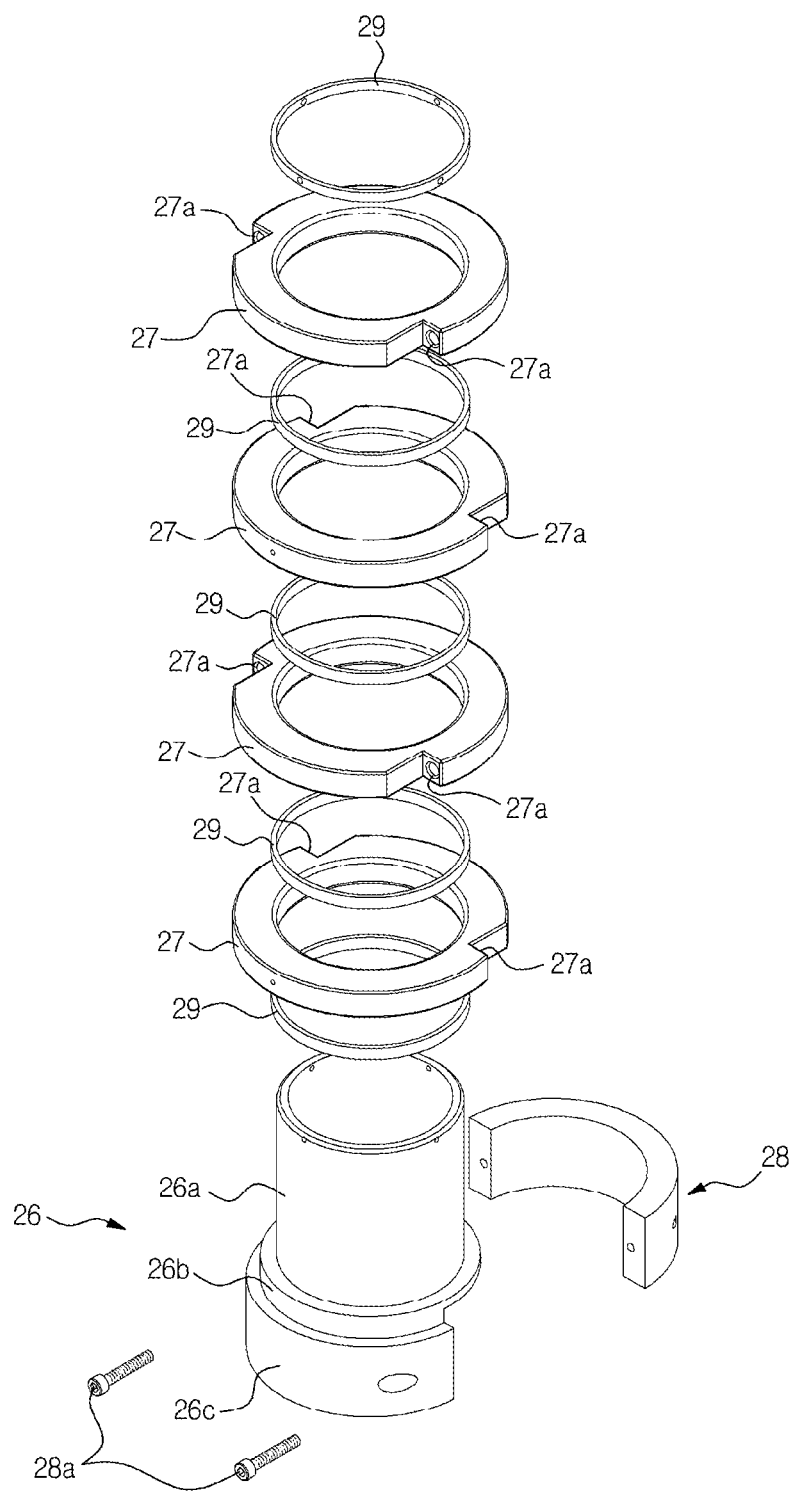
FIG. 3 is an exploded perspective view illustrating a thermal anchor of the magnetic resonance imaging apparatus according to the exemplary embodiment.

The thermal anchor 26 is installed at a head part of the cryogenic cooling device 23 to be cooled by the cryogenic cooling device 23, and the plurality of connecting rings 27 are cooled by the thermal anchor 26. The thermal anchor 26 is formed with a metal having high heat conductivity, and as illustrated on FIG. 3, includes a body part 26a inserted into an inner side of the connecting ring 27, a flange part 26b radially extended from one end of the body part 26a, and a fixation part 26c extended from the flange part 26b for the thermal anchor 26 to be fixedly installed at the head part of the cryogenic cooling device 23.

The connecting rings 27 of the exemplary embodiment have a circular ring shape, and the body part 26a has a cylindrical shape to correspond to an inner circumferential surface of the connecting rings 27.

In addition, the connecting rings 27 are formed with a conductive metal such that the wires W may be electrically connected to each other. Recessed or concave portions of an outer circumferential side of the connecting rings 27 are provided with a plurality of connecting parts 27a such that each of the plurality of wires W may be connected to each of the plurality of connecting parts 27a, and the plurality of connecting parts 27a is disposed while being spaced apart from each other in a circumferential direction of the connecting ring 27. Each of the plurality of connecting rings 27 of the exemplary embodiment is provided with two of the connecting parts 27a such that the wire W extended from the power supplying apparatus 40 and the wire W extended from the coil 21a may be connected to the two connecting parts 27a, respectively.

A fixation member 28 is installed on the fixation part 26c of the thermal anchor 26 through a fastening member 28a such as a screw, and the head part of the cryogenic cooling device 23 is fixedly installed in between the fixation part 26c and the fixation member 28. The fixation part 26c and the fixation member 28 of the exemplary embodiment have a semicircular arc shape, and thus the head part of the cryogenic cooling device 23 having a cylindrical shape may be fixed thereinbetween.

Thus, after installing the thermal anchor 26 at the head of the cryogenic cooling device 23 through the fixation part 26c and the fixation member 28 and the wire W extended from the power supplying apparatus 40 and the wire W extended from the coil 21a are connected to the two connecting parts 27a of the connecting ring 27, respectively, if heat from the outside is delivered by the wire W connected to the power supplying apparatus 40 when the thermal anchor 26 engages with the cryogenic cooling apparatus 23, the heat is absorbed to the cryogenic cooling device 23 through the connecting ring 27 to which the wire W is connected and through the thermal anchor 26 at which the connecting ring 27 is installed, thereby preventing the heat from being delivered to the coil 21a via the wire W.

The material of the connecting ring 27 of the exemplary embodiment is a material having greater heat contraction than that of the thermal anchor 26. The thermal anchor 26 of the exemplary embodiment is formed with copper material, and the connecting ring 27 is formed with aluminum material having greater heat contraction than the copper material.

As described previously, if the material of the connecting ring 27 is formed with a material having greater heat contraction than the heat contraction of the material of the thermal anchor 26, the connecting ring 27 may be easily installed at the body part 26a of the thermal anchor 26 at a room temperature, and at the same time, in a case when the thermal anchor 26 and the connecting ring 27 are cooled by the cryogenic cooling device 23, an inner circumferential surface of the connecting ring 27 is firmly fixed to an outer circumferential surface of the body part 26a of the thermal anchor 26 by being closely adhered, as the connecting ring 27 is contracted to a greater extent than the thermal anchor 26.

In addition, as described previously, the plurality of connecting rings 27 is sequentially installed at the body part 26a of the thermal anchor 26, and each of the plurality of connecting rings 27 is desired to be disposed while having a distance to each other as long as insulation and wiring are concerned. Thus, the body part 26a is provided with spacers 29 having a circular ring shape installed thereto, and the spacers 29 formed are disposed in between adjacent connecting rings 27. The spacers 29 have a predetermined thickness, and are alternately disposed with the connecting rings 27. Thus, the connecting rings 27 are installed on the body part 26a while being spaced apart from each other by a distance corresponding to the thickness of the spacer 29.

Figure 4:
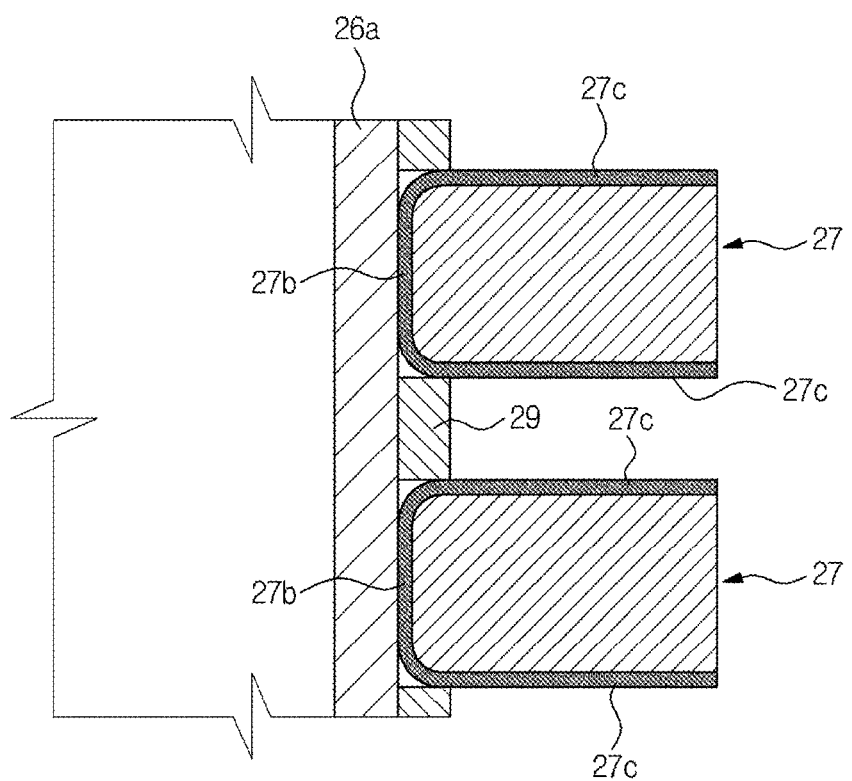
FIG. 4 is a partial, cross-sectional view illustrating an interface between connecting rings and a body part of a thermal anchor of the magnetic resonance imaging apparatus according to the exemplary embodiment.

In addition, as described previously, as each of the thermal anchor 26 and the connecting ring 27 is formed with a metallic material, the current delivered through the wire W may be delivered to the thermal anchor 26 or to the connecting ring 27 which is adjacent to the thermal anchor 26. Thus, as illustrated on FIG. 4, first and second insulation layers 27b and 27c are provided to prevent the current, which is delivered to the connecting ring 27, from being delivered to the thermal anchor 26 or to adjacent connecting rings 27.

The first insulation layer 27b is provided at an inner circumferential surface of the connecting ring 27 facing a body part 26a to prevent the current delivered through the wire W from being delivered to the thermal anchor 26. The second insulation layer 27c is provided at opposite surfaces of the connecting ring 27 substantially perpendicular to the inner circumferential surface to prevent the current delivered through the wire W from being delivered to the adjacent connecting rings 27. The connecting rings 27 of the exemplary embodiment are formed with aluminum, and surfaces of the connecting rings 27 are anodized to form an alumina layer that forms the insulation layers 27b and 27C at each connecting ring 27.

The insulation layers 27b and 27c are formed with the alumina layer, but the exemplary embodiment is not limited hereto, and the insulation layers 27b and 27c may be formed with various materials that may insulate electricity while heat delivery may be easily performed.

In addition, the thermal anchor 26 of the exemplary embodiment s formed with copper, but the exemplary embodiment is not limited hereto, and the thermal anchor 26 may be formed with a copper alloy. In addition, the connecting rings 27 may be formed, not only with aluminum, but also with other metals, such as aluminum alloy, magnesium, and magnesium alloy, having greater heat contraction than the thermal anchor 26.

The connecting rings 27 have a shape of a circular ring shape, and the body part 26a has a cylindrical shape to correspond with the connecting rings 27, but the exemplary embodiment is not limited hereto, and an inner surface of the connecting ring 27 and an outer surface of the body part 26a may have various shapes to correspond to each other, thereby enabling the connecting rings 27 to be installed at the body part 26a.

While exemplary embodiments have been particularly shown and described above, it would be appreciated by those skilled in the art that various changes may be made therein without departing from the principles and spirit of the present inventive concept as defined by the following claims.

What is claimed is:

1. A superconductive electromagnet apparatus comprising:
   a thermal anchor;
   a cryogenic cooling device which cools the thermal anchor;
   at least one connecting ring into which the thermal anchor is inserted; and
   a plurality of wires which are connected to the connecting ring,
   wherein the at least one connecting ring comprises a plurality of connecting parts to which the plurality of wire are connected.

2. A superconductive electromagnet apparatus comprising:
   a thermal anchor;
   a cryogenic cooling device which cools the thermal anchor;
   at least one connecting ring into which the thermal anchor is inserted; and
   a plurality of wires which are connected to the connecting ring,
   wherein the at least one connecting ring comprises a plurality of connecting parts to which the plurality of wire are connected, wherein the thermal anchor comprises:
      a body part which has a shape corresponding to a shape of an inner circumferential surface of the connecting ring and is inserted into an interior of the connecting ring; and a flange part which extends from a first end of the body part.

3. The superconductive electromagnet apparatus of claim 2, wherein the inner circumferential surface of the connecting ring a circular ring shape, and
   an outer surface of the body part has a cylindrical shape to correspond to the inner circumferential surface of the connecting ring.

4. The superconductive electromagnet apparatus of claim 2, wherein the at least one connecting ring comprises an insulation layer provided on a surface thereof.

5. The superconductive electromagnet apparatus of claim 4, wherein the insulation layer comprises a first insulation layer provided on an inner circumferential surface of the connecting ring which contacts the thermal anchor.

6. The superconductive electromagnet apparatus of claim 5, wherein the at least one connecting ring comprises a plurality of connecting rings which are sequentially installed on the body part, and
   the insulation layer comprises a second insulation layer provided on surfaces of each of the connecting rings substantially perpendicular to the inner circumferential surface which contacts the thermal anchor.

7. The superconductive electromagnet apparatus of claim 4, wherein the at least one connecting ring comprises aluminum, and
   the insulation layer comprises an anodized aluminum layer provided on a surface of the connecting ring.

8. A superconductive electromaganet apparatus comprising:
   a thermal anchor;
   a cryogenic cooling device which cools the thermal anchor;
   at least one connecting ring into which the thermal anchor is inserted; and
   a plurality of wires which are connected to the connecting ring,
   wherein the at least one connecting ring comprises a plurality of connecting parts to which the plurality of wire are connected,
   wherein the at least one connecting ring comprises a metal having a heat contraction that is greater than a heat contraction of the thermal anchor.

9. The superconductive electromagnet apparatus of claim 8, wherein the thermal anchor comprises a copper or a copper alloy material, and the connecting ring comprises a material selected from the group consisting of aluminum, aluminum alloy, magnesium, and magnesium alloy.

10. A superconductive electromagnet apparatus comprising:
    a thermal anchor;
    a cryogenic cooling device which cools the thermal anchor;
    at least one connecting ring into which the thermal anchor is inserted; and
    a plurality of wires which are connected to the connecting ring,
    wherein the at least one connecting ring comprises a plurality of connecting parts to which the plurality of wire are connected, wherein the thermal anchor comprises a fixation part fixed to the cryogenic cooling device; and
    the superconductive electromagnet apparatus further comprises a fixation member installed at the fixation part such that the cryogenic cooling device is installed between the fixation part and the fixation member.

11. The superconductive electromagnet apparatus of claim 10, wherein each of the fixation part and the fixation member has a semicircular arc shape.

12. A superconductive electromagnet apparatus comprising:
    a thermal anchor;
    a cryogenic cooling device which cools the thermal anchor;
    at least one connecting ring into which the thermal anchor is inserted; and
    a plurality of wires which are connected to the connecting ring,
    wherein the at least one connecting ring comprises a plurality of connecting parts to which the plurality of wire connected,
    further comprising:
    a coil which is supplied with a current to generate a magnetic field; and
    a power supplying apparatus which supplies a power to the coil,
    wherein the plurality of wires comprises a first wire extended from the coil and a second wire extended from the power supplying apparatus.

13. The superconductive electromagnet apparatus of claim 2, wherein the at least one connecting ring comprises a plurality of connecting rings sequentially installed at the body part, and
    the superconductive electromagnet apparatus further comprises:
    at least one spacer disposed between adjacent connecting rings of the plurality of connecting rings to maintain a distance between the adjacent connecting rings.

14. A magnetic resonance imaging apparatus configured to obtain a cross-section image of a body, the magnetic resonance imaging apparatus comprising the superconductive electromagnetic apparatus of claim 1.

15. A superconductive electromagnet apparatus comprising:
    a power supplying apparatus configured to supply a current;
    a coil configured to receive the current and generates a magnetic field;
    a thermal anchor;
    a cryogenic cooling device configured to cool the coil and the thermal anchor and maintains the coil at a cryogenic state;
    at least one connecting ring configured to engage with the thermal anchor;
    a first wire which extends from the coil and connects to the connecting ring; and
    a second wire which extends from the current supplying apparatus and connects to the connecting ring.

16. The superconductive electromagnet apparatus of claim 15, wherein the at least one connecting ring comprises a plurality of connecting rings configured to sequentially engage with the thermal anchor, and
    each of the plurality of connecting rings comprises a first insulation layer provided on an inner circumferential surface of the connecting ring which contacts the thermal anchor, and a second insulation layer provided on surfaces of the connecting ring substantially perpendicular to the inner circumferential surface.

17. The superconductive electromagnet apparatus of claim 15, wherein the at least one connecting ring comprises a metal having a heat contraction that is greater than a heat contraction of the thermal anchor.

18. The superconductive electromagnet apparatus of claim 15, wherein the at least one connecting ring comprises a plurality of connecting rings which are sequentially installed on the body part, and the superconductive electromagnetic apparatus further comprises at least one spacer disposed between adjacent connecting rings of the plurality of connecting rings to maintain a distance between the adjacent connecting rings.

19. A magnetic resonance imaging apparatus configured to obtain a cross-section image of a body, the magnetic resonance imaging apparatus comprising the superconductive electromagnetic apparatus of claim 15.

20. A superconductive electromagnet apparatus comprising:
- a thermal anchor having a body part, a flange part and a fixation part;
- a cryogenic cooling device connected to the fixation part of the thermal anchor; at least one connecting ring installed on the body part of the thermal anchor;
- a power supplying apparatus configured to supply a current;
- a wire which extends from the power supplying apparatus to the at least one connecting ring installed on the body part of the thermal anchor,
- wherein the cryogenic cooling device is configured to cool the thermal anchor and the thermal anchor is configured to prevent heat delivered from the power supplying apparatus through the wire from being delivered to a coil assembly of the superconductive electromagnet apparatus.

21. The superconductive electromagnet apparatus of claim 20, wherein the at least one connecting ring comprises a plurality of connecting rings which sequentially is installed on the thermal anchor, and
- each of the plurality of connecting rings comprises a first insulation layer provided on an inner circumferential surface of the connecting ring which contacts the thermal anchor, and a second insulation layer provided on surfaces of the connecting ring substantially perpendicular to the inner circumferential surface.

22. The superconductive electromagnet apparatus of claim 20, wherein the at least one connecting ring comprises a metal having a heat contraction that is greater than a heat contraction of the thermal anchor.

23. The superconductive electromagnet apparatus of claim 20, wherein the at least one connecting ring comprises a plurality of connecting rings which are sequentially installed on the body part, and
- the superconductive electromagnetic apparatus further comprises at least one spacer disposed between adjacent connecting rings of the plurality of connecting rings to maintain a distance between the adjacent connecting rings.

24. A magnetic resonance imaging apparatus configured to obtain a cross-section image of a body, the magnetic resonance imaging apparatus comprising the superconductive electromagnetic apparatus of claim 20.

* * * * *